(12) United States Patent
Honea et al.

(10) Patent No.: US 8,786,327 B2
(45) Date of Patent: Jul. 22, 2014

(54) ELECTRONIC COMPONENTS WITH REACTIVE FILTERS

(75) Inventors: James Honea, Santa Barbara, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 13/403,813

(22) Filed: Feb. 23, 2012

(65) Prior Publication Data
US 2012/0218025 A1 Aug. 30, 2012

Related U.S. Application Data

(60) Provisional application No. 61/447,519, filed on Feb. 28, 2011.

(51) Int. Cl.
*H03K 3/00* (2006.01)

(52) U.S. Cl.
USPC .......................................... 327/110; 327/424

(58) Field of Classification Search
USPC .......... 327/108–112, 310–311, 423–424, 551
See application file for complete search history.

(56) References Cited

U.S. PATENT DOCUMENTS

| | | | |
|---|---|---|---|
| 4,321,489 A | 3/1982 | Higuchi et al. | |
| 4,384,287 A | 5/1983 | Sakuma | |
| 4,665,508 A | 5/1987 | Chang | |
| 4,728,826 A | 3/1988 | Einzinger et al. | |
| 4,808,853 A | 2/1989 | Taylor | |
| 5,198,964 A | 3/1993 | Ito et al. | |
| 5,379,209 A | 1/1995 | Goff | |
| 5,493,487 A | 2/1996 | Close et al. | |
| 5,637,922 A | 6/1997 | Fillion et al. | |
| 5,789,951 A | 8/1998 | Shen et al. | |
| 5,952,856 A | 9/1999 | Horiguchi et al. | |
| 6,008,684 A | 12/1999 | Ker et al. | |

(Continued)

FOREIGN PATENT DOCUMENTS

| | | |
|---|---|---|
| CN | 101978589 | 2/2011 |
| CN | 102165694 | 8/2011 |

(Continued)

OTHER PUBLICATIONS

"L-C Filter Equations", Jun. 20, 2006, CircuitCalculator.com, http://circuitcalculator.com/lcfilter.htm.*

(Continued)

*Primary Examiner* — Lincoln Donovan
*Assistant Examiner* — Thomas Skibinski
(74) *Attorney, Agent, or Firm* — Fish & Richardson P.C.

(57) ABSTRACT

An electronic component comprising a half bridge adapted for operation with an electrical load having an operating frequency is described. The half bridge comprises a first switch and a second switch each having a switching frequency, the first switch and the second switch each including a first terminal, a second terminal, and a control terminal, wherein the first terminal of the first switch and the second terminal of the second switch are both electrically connected to a node. The electronic component further includes a filter having a 3 dB roll-off frequency, the 3 dB roll-off frequency being less than the switching frequency of the switches but greater than the operating frequency of the electrical load. The first terminal of the filter is electrically coupled to the node, and the 3 dB roll-off frequency of the filter is greater than 5 kHz.

82 Claims, 5 Drawing Sheets

(56) References Cited

U.S. PATENT DOCUMENTS

| | | | |
|---|---|---|---|
| 6,107,844 A | 8/2000 | Berg et al. |
| 6,130,831 A | 10/2000 | Matsunaga |
| 6,333,617 B1 | 12/2001 | Itabashi et al. |
| 6,395,593 B1 | 5/2002 | Pendharkar et al. |
| 6,521,940 B1 | 2/2003 | Vu et al. |
| 6,781,423 B1 | 8/2004 | Knoedgen |
| 6,900,657 B2 | 5/2005 | Bui et al. |
| 7,116,567 B2 | 10/2006 | Shelton et al. |
| 7,304,331 B2 | 12/2007 | Saito et al. |
| 7,378,883 B1 | 5/2008 | Hsueh |
| 7,443,648 B2 | 10/2008 | Cutter et al. |
| 7,477,082 B2 | 1/2009 | Fukazawa |
| 7,501,669 B2 | 3/2009 | Parikh et al. |
| 7,548,112 B2 | 6/2009 | Sheppard |
| 7,639,064 B2 | 12/2009 | Hsiao et al. |
| 7,719,055 B1 | 5/2010 | McNutt et al. |
| 7,746,020 B2 | 6/2010 | Schnetzka et al. |
| 7,795,642 B2 | 9/2010 | Suh et al. |
| 7,804,328 B2 | 9/2010 | Pentakota et al. |
| 7,851,825 B2 | 12/2010 | Suh et al. |
| 7,875,907 B2 | 1/2011 | Honea et al. |
| 7,875,914 B2 | 1/2011 | Sheppard |
| 7,884,394 B2 | 2/2011 | Wu et al. |
| 7,898,004 B2 | 3/2011 | Wu et al. |
| 7,915,643 B2 | 3/2011 | Suh et al. |
| 7,939,391 B2 | 5/2011 | Suh et al. |
| 7,965,126 B2 | 6/2011 | Honea et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,531,232 B2 | 9/2013 | Honea et al. |
| 8,541,818 B2 | 9/2013 | Wu et al. |
| 8,592,974 B2 | 11/2013 | Wu |
| 8,598,937 B2 | 12/2013 | Lal et al. |
| 8,624,662 B2 | 1/2014 | Parikh et al. |
| 8,633,518 B2 | 1/2014 | Suh et al. |
| 8,643,062 B2 | 2/2014 | Parikh et al. |
| 8,648,643 B2 | 2/2014 | Wu |
| 2002/0125920 A1 | 9/2002 | Stanley |
| 2003/0178654 A1 | 9/2003 | Thornton |
| 2004/0178831 A1 | 9/2004 | Li et al. |
| 2005/0067716 A1 | 3/2005 | Mishra et al. |
| 2005/0077947 A1 | 4/2005 | Munzer et al. |
| 2005/0146310 A1 | 7/2005 | Orr |
| 2005/0189561 A1 | 9/2005 | Kinzer et al. |
| 2005/0189562 A1 | 9/2005 | Kinzer et al. |
| 2006/0033122 A1 | 2/2006 | Pavier et al. |
| 2006/0043499 A1 | 3/2006 | De Cremoux et al. |
| 2006/0060871 A1 | 3/2006 | Beach |
| 2006/0102929 A1 | 5/2006 | Okamoto et al. |
| 2006/0176007 A1 | 8/2006 | Best |
| 2006/0237825 A1 | 10/2006 | Pavier et al. |
| 2006/0261473 A1 | 11/2006 | Connah et al. |
| 2007/0018210 A1 | 1/2007 | Sheppard |
| 2007/0080672 A1 | 4/2007 | Yang |
| 2007/0146045 A1 | 6/2007 | Koyama |
| 2007/0278518 A1 | 12/2007 | Chen et al. |
| 2008/0017998 A1 | 1/2008 | Pavio |
| 2008/0122418 A1 | 5/2008 | Briere et al. |
| 2008/0136390 A1* | 6/2008 | Briere ............... 323/282 |
| 2008/0158110 A1 | 7/2008 | Iida et al. |
| 2008/0191342 A1 | 8/2008 | Otremba |
| 2008/0203559 A1 | 8/2008 | Lee et al. |
| 2008/0248634 A1 | 10/2008 | Beach |
| 2008/0272404 A1 | 11/2008 | Kapoor |
| 2008/0283844 A1 | 11/2008 | Hoshi et al. |
| 2009/0072269 A1 | 3/2009 | Suh et al. |
| 2009/0180304 A1 | 7/2009 | Bahramian et al. |
| 2009/0201072 A1* | 8/2009 | Honea et al. ............... 327/424 |
| 2009/0215230 A1 | 8/2009 | Muto et al. |
| 2009/0236728 A1 | 9/2009 | Satou et al. |
| 2009/0278513 A1 | 11/2009 | Bahramian et al. |
| 2009/0315594 A1 | 12/2009 | Pentakota et al. |
| 2010/0067275 A1 | 3/2010 | Wang et al. |
| 2010/0073067 A1 | 3/2010 | Honea |
| 2011/0019450 A1 | 1/2011 | Callanan et al. |
| 2011/0025397 A1 | 2/2011 | Wang et al. |
| 2011/0121314 A1 | 5/2011 | Suh et al. |
| 2011/0169549 A1 | 7/2011 | Wu |
| 2011/0227095 A1 | 9/2011 | Treu et al. |
| 2012/0153390 A1 | 6/2012 | Mishra et al. |
| 2012/0306464 A1 | 12/2012 | Hirler et al. |

FOREIGN PATENT DOCUMENTS

| | | |
|---|---|---|
| CN | 102308387 | 1/2012 |
| EP | 2 188 842 | 5/2010 |
| EP | 2 243 213 | 10/2010 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |
| JP | 2010-539712 | 12/2010 |
| JP | 2011-512119 | 4/2011 |
| JP | 2012-517699 | 8/2012 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| WO | WO 2009/036181 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |

OTHER PUBLICATIONS

Authorized officer Keon Hyeong Kim, International Search Report and Written Opinion in PCT/US2008/076160 mailed Mar. 18, 2009, 11 pp.

Authorized officer Simin Baharlou, International Preliminary Report on Patentability in PCT/US2008/076160, mailed Mar. 25 2010, 6 pp.

Authorized officer Jae Woo Wee, International Search Report and Written Opinion in PCT/US2009/033699, mailed Sep. 21, 2009, 11 pp.

Authorized officer Dorothée Mülhausen, International Preliminary Report on Patentability in PCT/US2009/033699, mailed Aug. 26, 2010, 6 pp.

Authorized officer Sung Hee Kim, International Search Report and the Written Opinion in PCT/US2009/057554, mailed May 10, 2010, 13 pp.

Authorized Officer Gijsbertus Beijer, International Preliminary Report on Patentability in PCT/US2009/057554, mailed Mar. 29, 2011, 7 pp.

Authorized officer Sung Chan Chung, International Search Report and Written Opinion for PCT/US2010/021824, mailed Aug. 23, 2010, 9 pp.

Authorized officer Beate Giffo-Schmitt, International Preliminary Report on Patentability in PCT/US2010/021824, mailed Aug. 23, 2010, 6 pp.

Authorized officer Bon Gyoung Goo, International Search Report and Written Opinion in PCT/US2010/055129, mailed Jul. 1, 2011, 11 pp.

(56) References Cited

OTHER PUBLICATIONS

Authorized officer Yolaine Cussac, International Preliminary Report on Patentability in PCT/US2010/055129, mailed May 18, 2012, 6 pp.
Authorized officer Kee Young Park, International Search Report and Written Opinion in PCT/US2011/023485, mailed Sep. 23 2011, 10 pp.
Authorized officer Nora Lindner, International Preliminary Report on Patentability in PCT/US2011/023485, mailed Aug. 16, 2012, 7 pages.
Authorized officer Sung Joon Lee, International Search Report and Written Opinion in PCT/US2011/020592, mailed Sep. 19, 2011, 9 pages.
Authorized officer Philippe Bécamel, International Preliminary Report on Patentability in PCT/US2011/020592, mailed Jul. 19, 2012, 7 pages.
Authorized officer Kwak In Gu, International Search Report and Written Opinion in PCT/US2012/026810, mailed Jan. 23, 2013, 10 pages.
Chen, et al., "Single-Chip Boost Converter Using Monolithically Integrated AlGan/GaN Lateral Field-Effect Rectifier and Normally Off HEMT," IEEE Electron Device Letters, May 2009, 30(5):430-432.
Wu et al., "A 97.8% Efficient GaN HEMT Boost Converter with 300-W Output Power at 1MHz," Aug. 2008, Electronic Device Letters, IEEE, 29(8):824-826.
Authorized officer Lingfei Bai, International Preliminary Report on Patentability in PCT/US2012/026810, mailed Sep. 12, 2013, 6 pages.
U.S. Appl. No. 11/856,695, filed Sep. 17, 2007, Gallium Nitride Diodes and Integrated Components.
U.S. Appl. No. 14/108,642, filed Dec. 17, 2013, Gallium Nitride Power Devices.
U.S. Appl. No. 60/971,721, filed Sep. 12, 2007, III-Nitride Bilateral Switches.
U.S. Appl. No. 60/972,467, filed Sep. 14, 2007, Growing N-Polar III-Nitride Structures.
U.S. Appl. No. 12/209,504, filed Sep. 12, 2008, Growing N-Polar III-Nitride Structures.
U.S. Appl. No. 60/972,481, filed Sep. 14, 2007, III-Nitride Devices with Recessed Gates.
U.S. Appl. No. 61/012,755, filed Dec. 10, 2007, Insulated Gate E-Mode Transistors.
U.S. Appl. No. 61/028,133, filed Feb. 12, 2008, Bridge Circuits and their Components.
U.S. Appl. No. 13/887,204, filed May 3, 2013, Bridge Circuits and their Components.
U.S. Appl. No. 13/954,772, filed Jul. 30, 2013, Enhancement Mode III-N HEMTs.
U.S. Appl. No. 61/099,451, filed Sep. 23, 2008, Inductive Load Power Switching Circuits.
U.S. Appl. No. 13/959,483, filed Aug. 5, 2013, Inductive Load Power Switching Circuits.
U.S. Appl. No. 13/973,890, filed Aug. 22, 2013, Semiconductor Heterostructure Diodes.
U.S. Appl. No. 14/063,438, filed Oct. 25, 2013, Package Configurations for Low EMI Circuits.
U.S. Appl. No. 13/756,284, filed Jan. 31, 2013, Methods of Forming Reverse Side Engineered III-Nitride Devices.
U.S. Appl. No. 12/465,968, filed May 14, 2009, High Voltage III-Nitride Semiconductor Devices.
U.S. Appl. No. 13/748,907, filed Jan. 24, 2013, Semiconductor Devices with Field Plates.
U.S. Appl. No. 12/684,838, filed Jan. 8, 2010, Electronic Devices and Components for High Efficiency Power Circuits.
U.S. Appl. No. 14/057,089, filed Oct. 18, 2013, Semiconductor Electronic Components and Circuits.
U.S. Appl. No. 12/968,704, filed Dec. 15, 2010, Transistors with Isolated Regions.
U.S. Appl. No. 12/953,769, filed Nov. 24, 2010, Layer Structures for Controlling Stress of Heteroepitaxially Grown III-Nitride Layers.
U.S. Appl. No. 13/226,380, filed Sep. 6, 2011, Semiconductor Devices with Guard Rings.
U.S. Appl. No. 14/102,750, filed Dec. 11, 2013, III-N Device Structures and Methods.
U.S. Appl. No. 13/040,524, filed Mar. 4, 2011, Semiconductor Diodes with Low Reverse Bias Currents.
U.S. Appl. No. 13/040,940, filed Mar. 4, 2011, Electrode Configurations for Semiconductor Devices.
U.S. Appl. No. 61/447,519, filed Feb. 28, 2011, Electronic Components with Reactive Filters.
U.S. Appl. No. 61/568,022, filed Dec. 7, 2011, Semiconductor Modules and Methods of Forming the Same.
U.S. Appl. No. 13/690,103, filed Nov. 30, 2012, Semiconductor Modules and Methods of Forming the Same.
U.S. Appl. No. 13/366,090, filed Feb. 3, 2012, Buffer Layer Structures Suited for III-Nitride Devices with Foreign Substrates.
U.S. Appl. No. 14/134,878, filed Dec. 19, 2013, Semiconductor Power Modules and Devices.
U.S. Appl. No. 61/621,956, filed Apr. 9, 2012, N-Polar III-Nitride Transistors.
U.S. Appl. No. 13/859,635, filed Apr. 9, 2013, N-Polar III-Nitride Transistors.
U.S. Appl. No. 61/765,635, filed Feb. 15, 2013, Electrodes for Semiconductor Devices and Methods of Forming the Same.
U.S. Appl. No. 61/791,395, filed Mar. 15, 2013, Carbon Doping Semiconductor Devices.
U.S. Appl. No. 13/799,989, filed Mar. 13, 2013, Enhancement-Mode III-Nitride Devices.
U.S. Appl. No. 61/807,258, filed Apr. 1, 2013, Gate Drivers for Circuits Based on Semiconductor Devices.
U.S. Appl. No. 61/844,260, filed Jul. 9, 2013, Multilevel Inverters and their Components.
U.S. Appl. No. 61/856,573, filed Jul. 19, 2013, III-Nitride Transistor Including a P-Type Depleting Layer.
U.S. Appl. No. 13/231,308, filed Sep. 13, 2011, III-N Device Structures Having a Non-Insulating Substrate.
U.S. Appl. No. 14/068,944, filed Oct. 31, 2013, High Power Semiconductor Electronic Components with Increased Reliability.
U.S. Appl. No. 13/535,094, filed Jun. 27, 2012, Semiconductor Devices with Integrated Hole Collectors.
U.S. Appl. No. 13/550,445, filed Jul. 16, 2012, Semiconductor Electronic Components with Integrated Current Limiters.
U.S. Appl. No. 13/551,094, filed Jul. 17, 2012, Contacts for Semiconductor Devices and Methods of Forming the Same.
U.S. Appl. No. 61/672,723, filed Jul. 17, 2012, Devices and Components for Power Conversion Circuits.
U.S. Appl. No. 13/803,912, filed Mar. 14, 2013, Devices and Components for Power Conversion Circuits.
Napierala et al. (2006), "Selective GaN Epitaxy on Si(111) Substrates Using Porous Aluminum Oxide Buffer Layers," Journal of the Electrochemical Society, 153(2):G125-G127, 4 pages.
Japanese Office action in application No. 2010-546867, mailed Sep. 24, 2013, 14 pages.
Chinese Office Action in application No. 200980110230.0, mailed Jan. 24, 2014, 18 pages.

* cited by examiner

ELECTRONIC COMPONENTS WITH REACTIVE FILTERS

STATEMENT REGARDING FEDERALLY SPONSORED RESEARCH OR DEVELOPMENT

This invention was made with Government support awarded by ARPA-E [Award #DE-AR0000115]. The Government has certain rights in this invention [per Attachment 2 of the Award documents], including the right to revoke or modify the license to manufacture if the recipient is unable to expeditiously realize practical applications.

CROSS-REFERENCE TO RELATED APPLICATION

This application claims priority to U.S. Provisional Application No. 61/447,519, filed on Feb. 28, 2011. The disclosure of the prior application is considered part of and is incorporated by reference in the disclosure of this application.

TECHNICAL FIELD

This invention relates to electronic components and modules which involve filtering of voltage signals.

BACKGROUND

Figure 1:
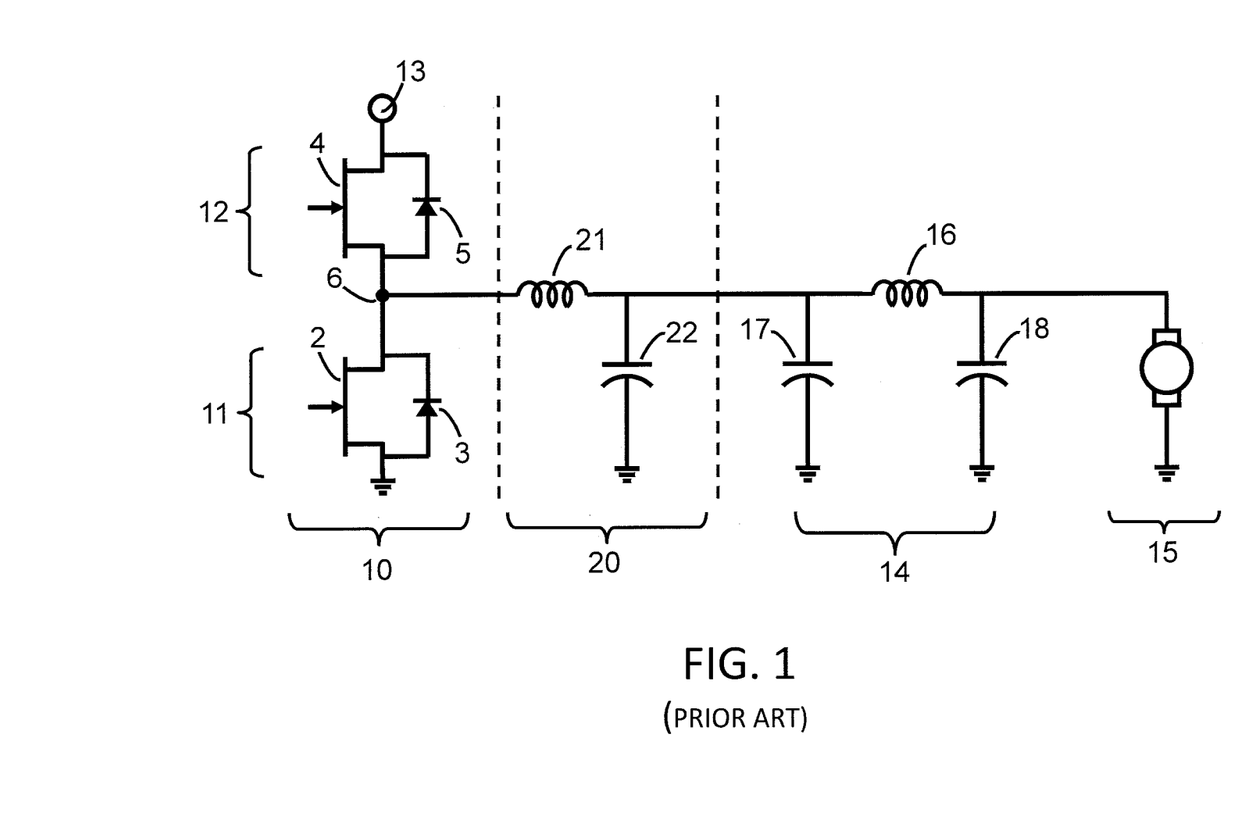
FIG. 1 is a circuit schematic of an inverter circuit of the prior art.

Bridge circuits are commonly used to deliver an AC voltage waveform to an electrical load. A common configuration for such a half bridge inverter circuit is shown in FIG. 1. Half bridge 10 includes two switches 11 and 12, the switches each including a transistor 2 and 4, respectively, such as an IGBT or MOSFET, connected anti-parallel to a diode 3 and 5, respectively, as shown. A pulsed-wave modulated (PWM) voltage source is used to control the gate voltage of each of the transistors of the switches 11 and 12, resulting in a switching waveform at the output 6 of the half bridge. A filter 20, which includes an inductive element 21 and a capacitive element 22, is then used to filter the switching waveform, resulting in the desirable low-frequency voltage or current waveform being delivered to the electrical load 15 at the output. The electrical load 15 is connected to the inverter circuit by an electrical connector 14, such as a cable, which in FIG. 1 is represented by inductor 16 and capacitors 17 and 18, connected as shown.

In applications in which the electrical load 15 has a substantial inductance, and therefore a substantial reactance, for example when the electrical load is a motor, the filter 20 can be omitted, and the reactance of the electrical load 15 can be used to filter the switching waveform. However, this technique has several disadvantages. Parasitic resonances in the cable 14 and motor 15 can be excited by the switching waveform, resulting in high-voltage spikes which damage the motor 15 and require over-specifying the voltage withstand of various components. Additionally, any capacitance in the cable 14 or motor 15 will be charged and discharged at the switching rate, which represents lost energy. Also, current spikes associated with charging and discharging the motor and cable capacitance constitute current dipoles or current loops which become emitters of electromagnetic interference.

Figure 2:
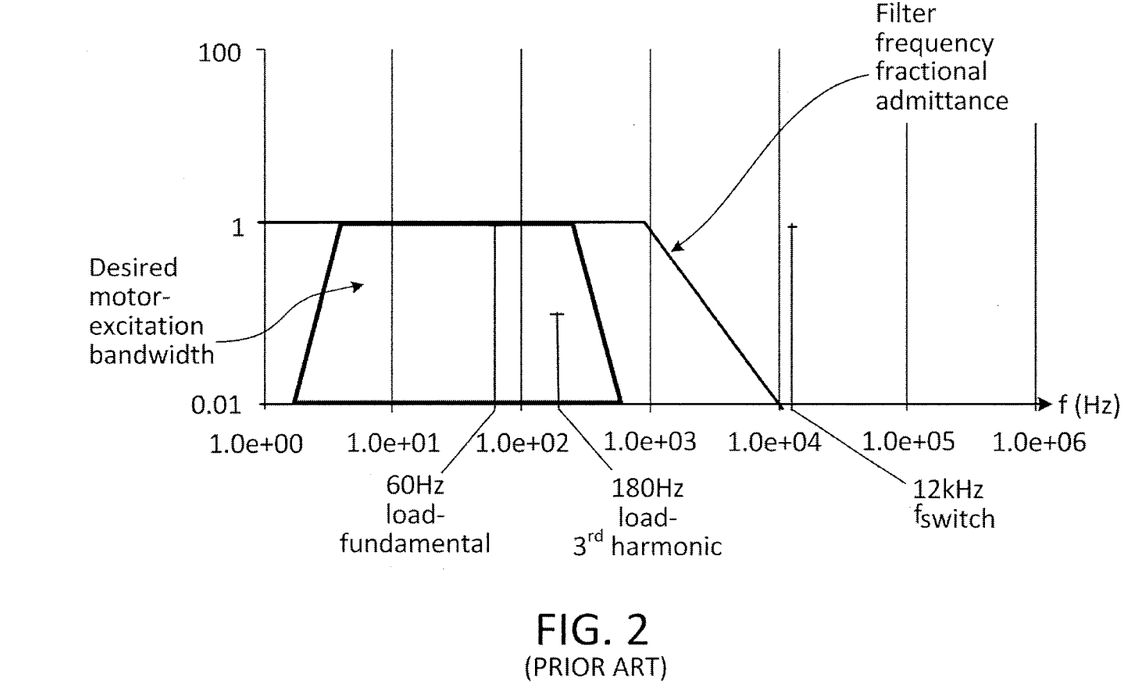
FIG. 2 is a representative plot of the frequency dependence of elements in the circuit of FIG. 1.

Inserting the filter 20 between the half bridge 10 and the cable 14 can eliminate the problems described above. However, the filter 20 must have a sufficiently low cut-off frequency to effectively attenuate the switching waveform. For conventional switches 11 and 12 used in the half bridge 10, the switching frequency is typically about 12 kHz, and is limited to no more than about 50 kHz, which is approximately the maximum frequency at which conventional switches 11 and 12 can be effectively switched without incurring unacceptably high switching losses. Consequently, the maximum frequency at which the fractional admittance of the filter is too high to prevent substantial output ripple at the switching frequency, i.e., the cut-off frequency of the filter, needs to be about 10 kHz or less, corresponding to a 3 dB roll-off frequency of about 1 kHz for the filter. The frequency response of the filter is illustrated in FIG. 2. As seen in the plot of the fractional admittance of the filter as a function of frequency, the fractional admittance drops substantially below 1 at a frequency close to 1 kHz and approaches a small value at a frequency of just above 10 kHz. Such a filter requires excessively large inductors and/or capacitors, resulting in a substantial increase in cost for the circuit. Furthermore, the half bridge inverter is limited to applications in which the frequency of the signal delivered to the electrical load 15 is much less than 1 kHz. There are many applications in which smaller, more compact inverter circuits are desirable.

SUMMARY

In one aspect, an electronic component comprising a half bridge adapted for operation with an electrical load having an operating frequency is described. The half bridge comprises a first switch and a second switch each having a switching frequency, the first switch and the second switch each including a first terminal, a second terminal, and a control terminal, wherein the first terminal of the first switch and the second terminal of the second switch are both electrically connected to a node. The electronic component further includes a filter having a 3 dB roll-off frequency, the 3 dB roll-off frequency being less than the switching frequency of the switches but greater than the operating frequency of the electrical load. The first terminal of the filter is electrically coupled to the node, and the 3 dB roll-off frequency of the filter is greater than 5 kHz.

In another aspect, an electronic component comprising a half bridge adapted for operation with an electrical load having an operating frequency is described. The half bridge comprises a first switch and a second switch each having a switching frequency, the first switch and the second switch each including a first terminal, a second terminal, and a control terminal, wherein the first terminal of the first switch and the second terminal of the second switch are both electrically connected to a node. The electronic component further includes a filter, with a first terminal of the filter being electrically coupled to the node. The half bridge and the filter form a module, and a volume of the module divided by a maximum output power of the electronic component is less than 6 cm$^3$/Watt.

In yet another aspect, an electronic component comprising a half bridge adapted for operation with an electrical load having an operating frequency is described. The half bridge comprises a first switch and a second switch each having a switching frequency, the first switch and the second switch each including a first terminal, a second terminal, and a control terminal, wherein the first terminal of the first switch and the second terminal of the second switch are both electrically connected to a node. The electronic component further includes a filter having a 3 dB roll-off frequency, the 3 dB roll-off frequency being less than the switching frequency of the switches but greater than the operating frequency of the electrical load, and the first terminal of the filter being electrically coupled to the node. The first switch and the second switch are each capable of being switched at a frequency of about 80 kHz or larger without sustaining substantial switching losses.

The electronic components described herein can each include one or more of the following features. The 3 dB roll-off frequency of the filter can be at least 10 kHz. The first switch can be a first transistor and the second switch can be a second transistor. The half bridge can consist of the first transistor and the second transistor. The first transistor and the second transistor can be III-N devices. The first transistor or the second transistor can be a switching transistor. The first transistor or the second transistor can be capable of being switched at a frequency of about 80 kHz or larger without sustaining substantial switching losses. The first transistor and the second transistor can be field-effect transistors. The first terminal of the first transistor can be a drain terminal, and the second terminal of the second transistor can be a source terminal. The first terminal of the second transistor can be a drain terminal, and the drain terminal of the second transistor can be electrically connected to a high voltage supply. The control terminals of the first transistor and the second transistor can be gate terminals. The half bridge can be free of diodes. The electronic component can further comprise an electrical connector connecting an electrical load to a second terminal of the filter. The electrical connector can be a cable. The electrical load can comprise a motor. The filter can include an inductive element and a capacitive element. The inductive element of the filter can be a first inductive element, and the electrical load can comprise a second inductive element. The electrical load can comprise a photovoltaic cell. The electrical load can have an operating frequency of about 1 kHz or larger. The electronic component can be part of an inverter circuit. The electronic component can be capable of outputting a substantially sinusoidal AC voltage signal. A frequency of the AC voltage signal can be about 1 kHz or larger. The electronic component can be capable of outputting a substantially sinusoidal AC current. A frequency of the AC current can be about 1 kHz or larger. A cut-off frequency of the filter can be greater than 50 kHz.

The volume of the module can be less than 360,000 cm$^3$ or less than 1800 cm$^3$. The footprint of the module can be less than 11,250 cm$^2$ or less than 225 cm$^2$. The maximum output power of the electronic component can be at least 100 Watts. The electronic component can further comprise an electrical connector connecting an electrical load to a second terminal of the filter. The electrical connector can be a cable. The electrical load can comprise a motor. The inductive element of the filter can be a first inductive element, and the electrical load can comprise a second inductive element. The electrical load can comprise a photovoltaic cell. The electrical load can have an operating frequency of about 1 kHz or larger. The electronic component can be part of an inverter circuit. The half bridge and the filter can be on a common substrate. The common substrate can comprise a printed circuit board. The 3 dB roll-off frequency of the filter can be greater than 5 kHz. The cut-off frequency of the filter can be greater than 50 kHz.

DESCRIPTION OF DRAWINGS

Like reference symbols in the various drawings indicate like elements.

DETAILED DESCRIPTION

Figure 3:
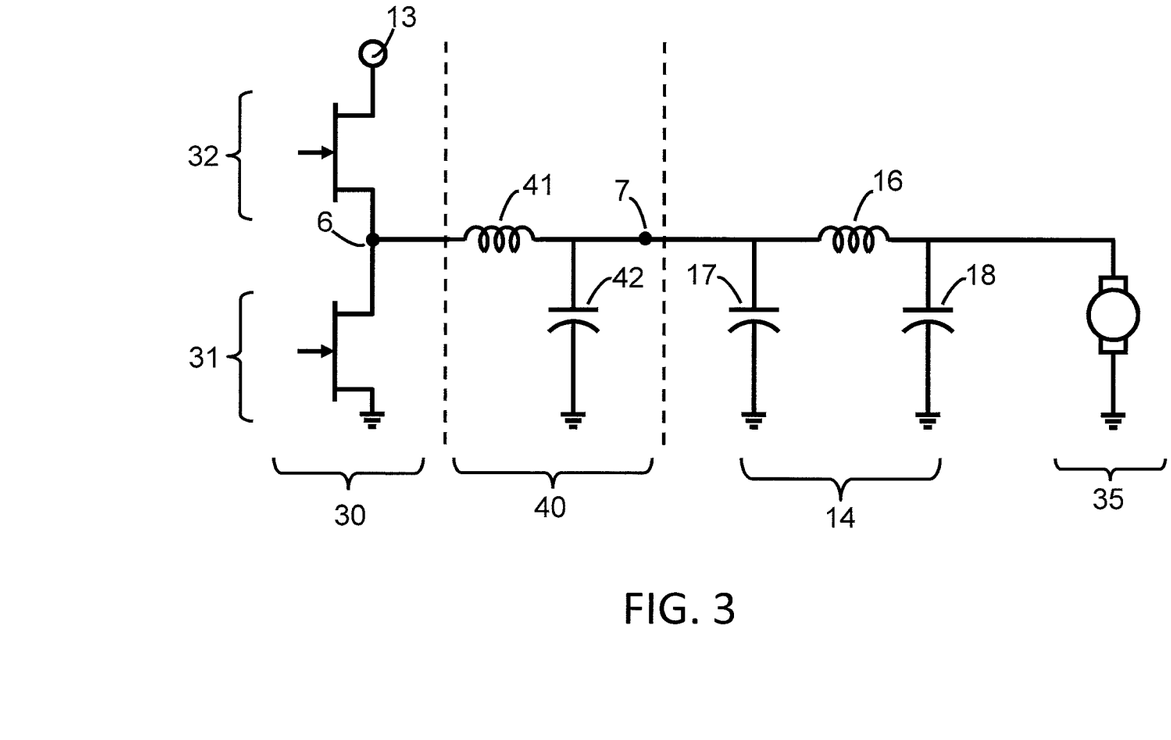
FIG. 3 is a circuit schematic of an implementation of an inverter circuit.

FIG. 3 illustrates an inverter circuit which can output a sinusoidal AC waveform to an electrical load at frequencies greater than 1 kHz without substantial distortion to or attenuation of the waveform. The inverter circuit includes a half bridge 30 connected to a filter 40. The half bridge 30 includes two switches 31 and 32, connected as shown. A low-side terminal of switch 31 is connected to ground, and a high-side terminal of switch 32 is connected to a high-voltage supply 13, as shown. The filter 40 includes an inductive element 41 and a capacitive element 42. The output 7 of the filter 40 is connected to an electrical load 35 by an electrical connector 14, such as a cable, which in FIG. 3 is represented by inductor 16 and capacitors 17 and 18, connected as shown.

Switches 31 and 32 are each capable of blocking a voltage which is at least equal to the voltage of the high-voltage supply 13. That is, when the switch is off, it can block any voltage which is less than or equal to the voltage of the high-voltage supply. In some implementations, the switches can each block a voltage which is at least two times the voltage of the high-voltage supply 13. As used herein, the term "blocking a voltage" refers to the ability of a switch, transistor, device, or component to prevent significant current, such as current that is greater than 0.001 times the average on-state operating current during regular conduction, from flowing through the switch, transistor, device, or component when a voltage is applied across the switch, transistor, device, or component. In other words, while a switch, transistor, device, or component is blocking a voltage that is applied across it, the total current passing through the transistor, device, or component will not be greater than 0.001 times the average on-state operating current during regular conduction.

Switches 31 and 32 are also capable of being switched at frequencies of at least 80 kHz or higher without sustaining substantial switching losses. Traditional high power switching devices which are capable of blocking high voltages as described above, such as IGBT's and power MOSFETs, which are typically silicon-based devices, experience switching losses at these frequencies that are greater than can be tolerated. On the other hand, III-Nitride or III-N field effect transistors, such as III-N HEMTs, have been shown to be capable of blocking the required high voltages while inherently being capable of higher switching speeds than a traditional IGBT or power MOS device. High voltage III-N devices, for example III-N HEMTs, have lower reverse recovery charge in the semiconductor portions as well as lower junction capacitances as compared to traditional IGBTs or power MOSFETs, and have been demonstrated to be capable of switching at frequencies which are in some cases at least as high as 1 MHz (1000 kHz), but typically greater than 80 kHz, greater than 100 kHz, greater than 300 kHz, or greater than 500 kHz, depending on the specific design. Furthermore, when a III-N transistor is used for switch 31 or 32, the switch does not require a diode, such as that required in each of the half bridge switches 11 and 12 of FIG. 1. This is because when III-N transistors are used, the freewheeling currents configured to pass through the diodes in the half bridge of FIG. 1 can instead pass through the channel of the III-N transistor, as described in U.S. patent application Ser. No. 12/368,200, filed Feb. 9, 2009 and published as publication number US 2009/0201072 A1, which is hereby incorporated by reference throughout. As such, each of switches 31 and 32 can be free of diodes, and the half bridge 30 can be free of diodes.

As used herein, the terms III-Nitride or III-N materials, layers, devices, structures, etc., refer to a material, device, or structure comprised of a compound semiconductor material according to the stoichiometric formula $Al_xIn_yGa_zN$, where x+y+z is about 1. In a III-Nitride or III-N device, the conductive channel can be partially or entirely contained within a III-N material layer.

Figure 4:
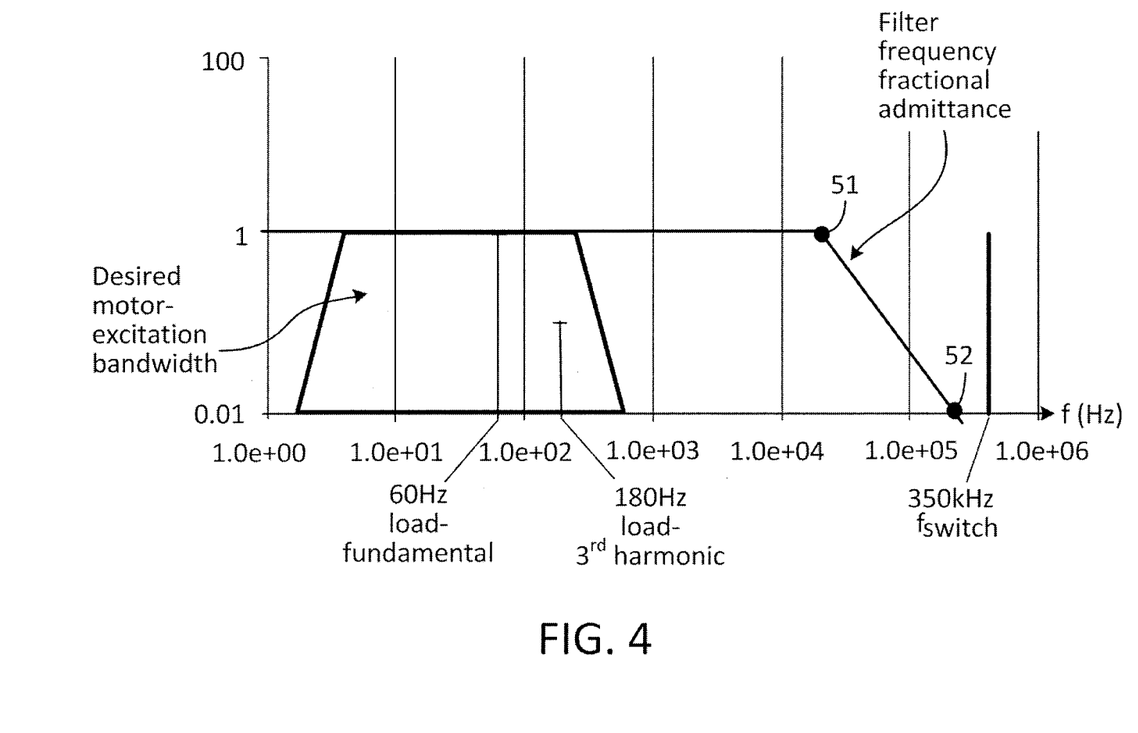
FIG. 4 is a representative plot of the frequency dependence of elements in the circuit of FIG. 3.

FIG. 4 shows a representative plot of the frequency response of the filter 40 that can be used to filter the switching waveform when the switches 31 and 32 are switched at a frequency greater than 80 kHz (in this case 350 kHz). As shown, the filter can be a low-pass filter, the 3 dB roll-off frequency 51 is about 30 kHz, and the cut-off frequency 52 is about 300 kHz. The 3 dB roll-off frequency is defined as the frequency at which the output voltage signal is attenuated by 3 dB relative to the input signal. Attenuation by the filter increases monotonically with frequency. As such, signals of higher frequency than the 3 dB roll-off frequency are attenuated by more than 3 dB, and signals of lower frequency than the 3 dB roll-off frequency are attenuated by less than 3 dB. For the filter 40 in FIG. 3, the 3 dB roll-off frequency $f_3$ dB is given by the equation:

$$f_{3dB} = (4\pi^2 LC)^{1/2}$$

where L is the inductance of inductor 41 and C is the capacitance of capacitor 42.

The cut-off frequency of the filter is the frequency above which the fractional admittance (i.e., the ratio of a voltage signal applied at the input to that at the output) of the filter is low enough to prevent substantial output ripple at the switching frequency. The cut-off frequency is typically about 10 times the 3 dB roll-off frequency, but in applications where only very small output ripple can be tolerated, or for filters with a frequency roll-off that is smaller than 40 dB per decade, the cut-off frequency may be higher, for example about 20 times the 3 dB roll-off frequency.

For a filter with a higher 3 dB roll-off frequency, and therefore a higher cut-off frequency, the size of the inductor and/or capacitor can be reduced. When the switches 31 and 32 are switched at a frequency of about 80 kHz or greater, the cut-off frequency of the filter can be at least as high as 50 kHz, and the 3 dB roll-off frequency can be at least as high as 5 kHz or 10 kHz. When the switches 31 and 32 are switched at higher frequencies, for example at least 100 kHz, at least 200 kHz, at least 350 kHz, at least 500 kHz, or at least 1 MHz (1000 kHz), the cut-off frequency of the filter can be higher, for example at least 80 kHz, at least 150 kHz, at least 300 kHz, at least 450 kHz, or at least 900 kHz. The 3 dB roll-off frequency can be at least 12 kHz, at least 20 kHz, at least 30 kHz, at least 50 kHz, or at least 100 kHz.

Referring again to FIG. 3, because of the high 3 dB roll-off and cut-off frequencies that filter 40 can be designed to have when combined with a half bridge 30 that is switched at these higher frequencies, the frequency of the voltage and/or current signal applied to electrical load 35 can be high. For example, a sinusoidal waveform of at least 1 kHz, at least 2 kHz, at least 5 kHz, at least 10 kHz, at least 50 kHz, or at least 100 kHz can be applied. An additional benefit of enabling a very high switching frequency, combined with a filter with high 3 dB and cut-off frequencies, is that the output waveform is not limited to a single-frequency sine wave. With adequate spacing between the fundamental excitation frequency and the switching frequency, multiple higher harmonics of the fundamental can also be faithfully included in the output waveform. Use of a $3^{rd}$ harmonic is sometimes employed today with three phase motors as a way of utilizing the full available voltage. With the configuration of FIG. 3, even higher harmonics could be introduced, such as a $5^{th}$ harmonic or a $7^{th}$ harmonic. For example, harmonic pre-distortion could be applied to the waveform to compensate for nonlinearity of the motor's magnetizing inductance. This could be particularly useful in designs where the magnetic circuit is operated at or near saturation of the magnetic material.

Another advantage to having a filter 40 with such high 3 dB and cut-off frequencies, and correspondingly small inductive and capacitive elements 41 and 42, respectively, is that the filter and/or the entire circuit can be made extremely compact. For a conventional inverter circuit designed to deliver about 1 kW of power to an electrical load, the total volume of the filter alone can be around $10^4$ cm$^3$ or higher. Furthermore, the total volume of the filter scales approximately linearly with output power. Hence, higher output power requires even larger filter components, leading to excessively high costs for the filter, and preventing use of the inverter circuit in applications that require a more compact design.

Using the configuration of FIG. 3, for an inverter designed to operate at greater than 100 W, for example about 0.3-2 kW, the filter can be made small enough to be integrated with the half bridge into a single module with a total volume less than about 1800 cm$^3$, such as less than 1200 cm$^3$ or less than 800 cm$^3$. The half bridge and the filter can, for example, be mounted on a common substrate, such as a printed circuit board (PCB), within the module. Since the total volume of the module scales approximately linearly with the output power, the volume of the module divided by the maximum output power can be less than 6 cm$^3$/Watt, such as less than 5 cm$^3$/Watt, less than 4 cm$^3$/Watt or less than 2 cm$^3$/Watt. For larger output powers, for example about 200 kW or greater, or about 500 kW or greater, the total volume of the module can still be less than about 360,000 cm$^3$, such as less than 300,000 cm$^3$, less than 200,000 cm$^3$, or less than 100,000 cm$^3$.

Furthermore, the footprint of the module (i.e., the area occupied by the module as viewed from above) when the configuration of FIG. 3 is used can be made extremely small and compact. For example, the footprint of the module in an inverter designed for an output power of about 200 kW or greater can be about 11,250 cm$^2$ or less, such as less than 10,000 cm$^2$ or less than 8,000 cm$^2$. The footprint of the module in an inverter designed for an output power of about 100 W or greater, such as between 0.3 and 2 kW, can be about 225 cm$^2$ or less, such as less than 200 cm$^2$ or less than 150 cm$^2$.

Figure 5A:
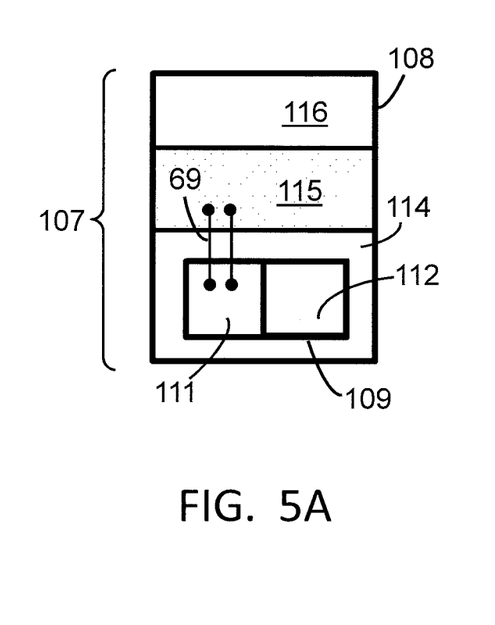
FIG. 5A is a plan view of a hybrid electronic device that can be used as a switch in a bridge circuit.
Figure 5B:
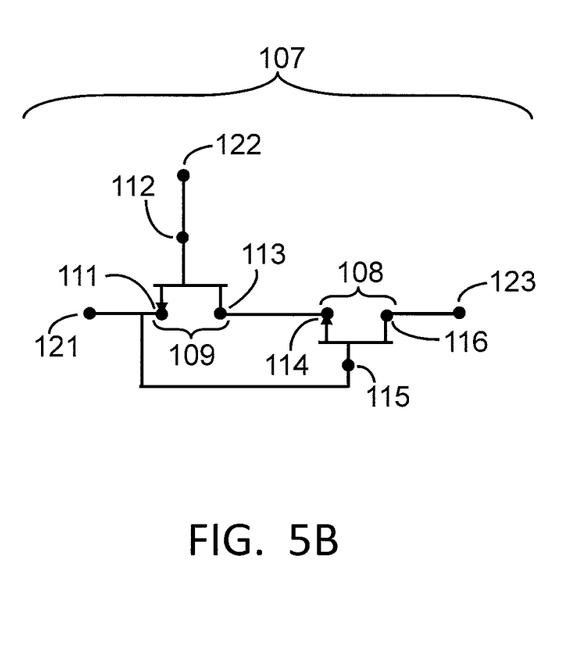
FIG. 5B is a schematic circuit representation of the device of FIG. 5A.

While the switches 31 and 32 in FIG. 3 are each shown to be formed of single transistors, other devices which can inherently be switched at high frequencies could be used instead. For example, a hybrid device 107, shown in FIGS. 5A and 5B, could be used for either of switches 31 and 32. It is often preferable that switches 31 and 32 be enhancement-mode or E-mode devices. That is, the switch is in the off state when the control terminal is held at the same voltage as the low-side terminal, and is turned on by switching the voltage at the control terminal to a sufficiently high positive voltage relative to the low-side terminal. Since single high-voltage enhancement-mode transistors can be difficult to fabricate reliably, one alternative to a single high-voltage E-mode transistor is to combine a high-voltage depletion-mode (D-mode) transistor 108 with a low-voltage E-mode transistor 109 in the configuration of FIGS. 5A and 5B to form a hybrid device 107. Hybrid device 107 can be operated in the same way as a single high-voltage E-mode transistor, and in many cases achieves the same or similar output characteristics as a single high-voltage E-mode transistor. FIG. 5A shows a plan view schematic diagram of hybrid device 107, and FIG. 5B shows a circuit schematic of hybrid device 107. Hybrid device 107 includes a high-voltage D-mode transistor 108 and a low-voltage E-mode transistor 109. In the configuration illustrated in FIGS. 5A and 5B, E-mode transistor 109 is a vertical transistor, having its drain electrode 113 on the opposite side of the device from its source electrode 111 and gate electrode 112, and D-mode transistor 108 is a lateral transistor, having its source electrode 114, gate electrode 115, and drain electrode 116 all on the same side of the device. However, other configurations for each of transistors 108 and 109 are possible as well.

The source electrode 111 of the low-voltage E-mode transistor 109 and the gate electrode 115 of the high-voltage D-mode transistor 108 are both electrically connected together, for example with wire bonds 69, and together form the source 121 of the hybrid device 107. The gate electrode 112 of the low-voltage E-mode transistor 109 forms the gate 122 of the hybrid device 107. The drain electrode 116 of the high-voltage D-mode transistor 108 forms the drain 123 of the hybrid device 107. The source electrode 114 of the high-voltage D-mode transistor 108 is electrically connected to the drain electrode 113 of the low-voltage E-mode transistor 109. As seen in FIG. 5A, drain electrode 113, which is on the opposite side of the E-mode transistor 109 from the source and drain electrodes 111 and 112, respectively, can be electrically connected to source electrode 114 by mounting the low-voltage E-mode transistor 109 directly on top of the source electrode 114 with the drain electrode 113 directly contacting the source electrode 114, for example by using a conductive solder or resin. As such, the footprint (and therefore the cross-sectional area) of the low-voltage E-mode transistor 109 can be smaller than that of the high-voltage D-mode transistor 108, and in particular the footprint of the low-voltage E-mode transistor 109 can be smaller than that of the source electrode 114 high-voltage D-mode transistor 108.

As used herein, a "hybrid enhancement-mode electronic device or component", or simply a "hybrid device or component", is an electronic device or component formed of a depletion-mode transistor and a enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within the hybrid component in which a low-voltage transistor is used. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

In FIGS. 5A and 5B, D-mode transistor 108 can be a III-Nitride transistor, such as a III-N HEMT, and E-mode transistor 109 can be a Silicon-based device, such as a Si MOSFET. Alternatively, E-mode transistor 109 can be a III-N transistor as well. Because E-mode transistor 109 is a low-voltage device, and therefore does not need to be capable of blocking the entire circuit high voltage, it can be made to switch much faster than a high-voltage device formed of the same material. Hybrid device 107 can therefore be capable of operating at the higher switching frequencies for which filter 40 is designed.

A number of implementations have been described. Nevertheless, it will be understood that various modifications may be made without departing from the spirit and scope of the techniques and devices described herein. For example, alternative configurations for the filter could be used. Or, the low side terminal of switch 31 in FIG. 3 could be connected to a common AC return, which in some cases could be at a negative voltage, rather than connected to ground. Or, alternative configurations for the hybrid device 107 in FIGS. 5A and 5B could be used. For example, rather than the stacked configuration of FIG. 5A, the two transistors 108 and 109 could be formed on a common substrate. In that case, source 111 of transistor 109 would not necessarily need to be wire bonded to gate 115 of transistor 108. Electrodes 111 and 115 could be connected by alternative means, for example by an interconnect metal. Accordingly, other implementations are within the scope of the following claims.

What is claimed is:

1. An electronic component, comprising:
a half bridge adapted for operation with an electrical load having an operating frequency, the half bridge comprising a first switch and a second switch each having a switching frequency, the first switch and the second switch each including a first terminal, a second terminal, and a control terminal, wherein the first terminal of the first switch and the second terminal of the second switch are both electrically connected to a node; and
a filter having a 3 dB roll-off frequency, the 3 dB roll-off frequency being less than the switching frequency of the switches but greater than the operating frequency of the electrical load, and the first terminal of the filter being electrically coupled to the node; wherein
the first switch or the second switch comprises a high-voltage depletion-mode transistor and a low-voltage enhancement-mode transistor, the high-voltage depletion-mode transistor comprising a source electrode, and the low-voltage enhancement-mode transistor being mounted directly on top of the source electrode of the high-voltage depletion-mode transistor; and
the 3 dB roll-off frequency of the filter is greater than 5 kHz.

2. The electronic component of claim 1, wherein the 3 dB roll-off frequency of the filter is at least 10 kHz.

3. The electronic component of claim 1, wherein the high-voltage depletion-mode transistor is a III-N device.

4. The electronic component of claim 1, wherein the high-voltage depletion-mode transistor is a switching transistor.

5. The electronic component of claim 4, wherein the high-voltage depletion-mode transistor is configured to be switched at a frequency of about 80 kHz or larger without sustaining substantial switching losses.

6. The electronic component of claim 1, wherein the high-voltage depletion-mode transistor is a field-effect transistor.

7. The electronic component of claim 1, wherein the first terminal of the first switch is a drain terminal, and the second terminal of the second switch is a source terminal.

8. The electronic component of claim 1, wherein the first terminal of the second switch is a drain terminal, and the drain terminal of the second switch is electrically connected to a high voltage supply.

9. The electronic component of claim 1, wherein the control terminals of the first switch and the second switch are gate terminals.

10. The electronic component of claim 1, wherein the half bridge is free of diodes.

11. The electronic component of claim 1, further comprising an electrical connector connecting the electrical load to a second terminal of the filter.

12. The electronic component of claim 11, wherein the electrical connector is a cable.

13. The electronic component of claim 1, wherein the electrical load comprises a motor.

14. The electronic component of claim 1, wherein the filter comprises an inductive element and a capacitive element.

15. The electronic component of claim 14, wherein the inductive element of the filter is a first inductive element, and the electrical load comprises a second inductive element.

16. The electronic component of claim 1, wherein the electrical load comprises a photovoltaic cell.

17. The electronic component of claim 1, wherein the electrical load has an operating frequency of about 1 kHz or larger.

18. The electronic component of claim 1, wherein the electronic component is part of an inverter circuit.

19. The electronic component of claim 1, wherein the electronic component is capable of outputting a substantially sinusoidal AC voltage signal.

20. The electronic component of claim 19, wherein a frequency of the AC voltage signal is about 1 kHz or larger.

21. The electronic component of claim 1, wherein the electronic component is capable of outputting a substantially sinusoidal AC current.

22. The electronic component of claim 21, wherein a frequency of the AC current is about 1 kHz or larger.

23. The electronic component of claim 1, wherein a cut-off frequency of the filter is greater than 50 kHz.

24. An electronic component, comprising:
a half bridge adapted for operation with an electrical load having an operating frequency, the half bridge comprising a first switch and a second switch each having a switching frequency, the first switch and the second switch each including a first terminal, a second terminal, and a control terminal, wherein the first terminal of the first switch and the second terminal of the second switch are both electrically connected to a node; and
a filter, a first terminal of the filter being electrically coupled to the node; wherein
the first switch or the second switch comprises a high-voltage depletion-mode transistor and a low-voltage enhancement-mode transistor, the high-voltage depletion-mode transistor comprising a source electrode, and the low-voltage enhancement-mode transistor being mounted directly on top of the source electrode of the high-voltage depletion-mode transistor; and
the half bridge and the filter form a module, and a volume of the module divided by a maximum output power of the electronic component is less than 6 $cm^3$/Watt.

25. The electronic component of claim 24, wherein the volume of the module is less than 360,000 $cm^3$.

26. The electronic component of claim 24, wherein the footprint of the module is less than 11,250 $cm^2$.

27. The electronic component of claim 24, wherein the volume of the module is less than 1800 $cm^3$.

28. The electronic component of claim 24, wherein the footprint of the module is less than 225 $cm^2$.

29. The electronic component of claim 24, wherein the maximum output power of the electronic component is at least 100 Watts.

30. The electronic component of claim 24, further comprising an electrical connector connecting an electrical load to a second terminal of the filter.

31. The electronic component of claim 30, wherein the electrical connector is a cable.

32. The electronic component of claim 30, wherein the electrical load comprises a motor.

33. The electronic component of claim 30, wherein the inductive element of the filter is a first inductive element, and the electrical load comprises a second inductive element.

34. The electronic component of claim 30, wherein the electrical load comprises a photovoltaic cell.

35. The electronic component of claim 30, wherein the electrical load has an operating frequency of about 1 kHz or larger.

36. The electronic component of claim 24, wherein the electronic component is part of an inverter circuit.

37. The electronic component of claim 24, wherein the electronic component is capable of outputting a substantially sinusoidal AC voltage signal.

38. The electronic component of claim 37, wherein a frequency of the AC voltage signal is about 1 kHz or larger.

39. The electronic component of claim 24, wherein the electronic component is capable of outputting a substantially sinusoidal AC current.

40. The electronic component of claim 39, wherein a frequency of the AC current is about 1 kHz or larger.

41. The electronic component of claim 24, wherein the half bridge and the filter are on a common substrate.

42. The electronic component of claim 41, wherein the substrate comprises a printed circuit board.

43. The electronic component of claim 24, wherein the filter comprises an inductive element and a capacitive element.

44. An electronic component, comprising:
a half bridge adapted for operation with an electrical load having an operating frequency, the half bridge comprising a first switch and a second switch each having a switching frequency, the first switch and the second switch each including a first terminal, a second terminal, and a control terminal, wherein the first terminal of the first switch and the second terminal of the second switch are both electrically connected to a node; and
a filter having a 3 dB roll-off frequency, the 3 dB roll-off frequency being less than the switching frequency of the switches but greater than the operating frequency of the electrical load, and the first terminal of the filter being electrically coupled to the node; wherein
the first switch or the second switch comprises a high-voltage depletion-mode transistor and a low-voltage enhancement-mode transistor, the high-voltage depletion-mode transistor comprising a source electrode, and the low-voltage enhancement-mode transistor being mounted directly on top of the source electrode of the high-voltage depletion-mode transistor; and
the first switch and the second switch are each configured to be switched at a frequency of about 80 kHz or larger without sustaining substantial switching losses during operation of the electronic component.

45. The electronic component of claim 44, wherein the 3 dB roll-off frequency of the filter is greater than 5 kHz.

46. The electronic component of claim 44, wherein a cut-off frequency of the filter is greater than 50 kHz.

47. The electronic component of claim 44, wherein the high-voltage depletion-mode transistor is a III-N device.

48. The electronic component of claim 44, wherein the high-voltage depletion-mode transistor is a field-effect transistor.

49. The electronic component of claim 44, wherein the first switch comprises the high-voltage depletion-mode transistor and the low-voltage enhancement-mode transistor, the second switch comprises a second high-voltage depletion-mode transistor and a second low-voltage enhancement-mode transistor, the first terminal of the first switch is a drain terminal of the high-voltage depletion-mode transistor, and the second terminal of the second switch is a source terminal of the second low-voltage enhancement-mode transistor.

50. The electronic component of claim 44, wherein the second terminal of the first switch is a source terminal of the low-voltage enhancement-mode transistor, and the source terminal of the low-voltage enhancement-mode transistor is electrically connected to ground.

51. The electronic component of claim 44, wherein the first terminal of the second switch is a drain terminal of the high-voltage depletion-mode transistor, and the drain terminal of the high-voltage depletion-mode transistor is electrically connected to a high voltage supply.

52. The electronic component of claim 44, wherein the first switch comprises the high-voltage depletion-mode transistor and the low-voltage enhancement-mode transistor, the second switch comprises a second high-voltage depletion-mode transistor and a second low-voltage enhancement-mode transistor, and the control terminals of the first switch and the second switch are gate terminals of the low-voltage enhancement-mode transistor and the second low-voltage enhancement-mode transistor, respectively.

53. The electronic component of claim 44, wherein the half bridge is free of diodes.

54. The electronic component of claim 44, further comprising an electrical connector connecting an electrical load to a second terminal of the filter.

55. The electronic component of claim 54, wherein the electrical connector is a cable.

56. The electronic component of claim 54, wherein the electrical load comprises a motor.

57. The electronic component of claim 44, wherein the filter comprises an inductive element and a capacitive element.

58. The electronic component of claim 57, wherein the inductive element of the filter is a first inductive element, and the electrical load comprises a second inductive element.

59. The electronic component of claim 44, wherein the electrical load comprises a photovoltaic cell.

60. The electronic component of claim 44, wherein the electrical load has an operating frequency of about 1 kHz or larger.

61. The electronic component of claim 44, wherein the electronic component is part of an inverter circuit.

62. The electronic component of claim 44, wherein the electronic component is capable of outputting a substantially sinusoidal AC voltage signal.

63. The electronic component of claim 62, wherein a frequency of the AC voltage signal is about 1 kHz or larger.

64. The electronic component of claim 44, wherein the electronic component is capable of outputting a substantially sinusoidal AC current.

65. The electronic component of claim 64, wherein a frequency of the AC current is about 1 kHz or larger.

66. The electronic component of claim 1, wherein the high-voltage depletion-mode transistor and the low-voltage enhancement-mode transistor are configured to be operated as a single high-voltage enhancement-mode transistor.

67. The electronic component of claim 1, wherein a source electrode of the high-voltage depletion-mode transistor is electrically connected to a drain electrode of the low-voltage enhancement-mode transistor.

68. The electronic component of claim 1, wherein the high-voltage depletion-mode transistor is a III-Nitride transistor and the low-voltage enhancement-mode transistor is a silicon MOSFET.

69. The electronic component of claim 1, wherein the high-voltage depletion-mode transistor is a lateral transistor and the low-voltage enhancement-mode transistor is a vertical transistor.

70. The electronic component of claim 1, wherein the half bridge and the filter are on a common substrate.

71. The electronic component of claim 70, wherein the substrate comprises a printed circuit board.

72. The electronic component of claim 24, wherein the high-voltage depletion-mode transistor and the low-voltage enhancement-mode transistor are configured to be operated as a single high-voltage enhancement-mode transistor.

73. The electronic component of claim 24, wherein a source electrode of the high-voltage depletion-mode transistor is electrically connected to a drain electrode of the low-voltage enhancement-mode transistor.

74. The electronic component of claim 24, wherein the high-voltage depletion-mode transistor is a III-Nitride transistor and the low-voltage enhancement-mode transistor is a silicon MOSFET.

75. The electronic component of claim 24, wherein the high-voltage depletion-mode transistor is a lateral transistor and the low-voltage enhancement-mode transistor is a vertical transistor.

76. The electronic component of claim 44, wherein the high-voltage depletion-mode transistor and the low-voltage enhancement-mode transistor are configured to be operated as a single high-voltage enhancement-mode transistor.

77. The electronic component of claim 44, wherein a source electrode of the high-voltage depletion-mode transistor is electrically connected to a drain electrode of the low-voltage enhancement-mode transistor.

78. The electronic component of claim 44, wherein the high-voltage depletion-mode transistor is a III-Nitride transistor and the low-voltage enhancement-mode transistor is a silicon MOSFET.

79. The electronic component of claim 44, wherein the high-voltage depletion-mode transistor is a lateral transistor and the low-voltage enhancement-mode transistor is a vertical transistor.

80. The electronic component of claim 44, wherein the half bridge and the filter are on a common substrate.

81. The electronic component of claim 80, wherein the substrate comprises a printed circuit board.

82. An electronic component, comprising:
a half bridge adapted for operation with an electrical load having an operating frequency, the half bridge comprising a first switch and a second switch each having a switching frequency, the first switch and the second switch each including a first terminal, a second terminal, and a control terminal, wherein the first terminal of the first switch and the second terminal of the second switch are both electrically connected to a node; and
a filter having a 3 dB roll-off frequency, the 3 dB roll-off frequency being less than the switching frequency of the switches but greater than the operating frequency of the electrical load, and the first terminal of the filter being electrically coupled to the node; wherein
the first switch or the second switch comprises a high-voltage depletion-mode transistor and a low-voltage enhancement-mode transistor, the high-voltage depletion-mode transistor comprising a source electrode, and the low-voltage enhancement-mode transistor being mounted directly on top of the source electrode of the high-voltage depletion-mode transistor.

\* \* \* \* \*